United States Patent
Boulemnakher et al.

(10) Patent No.: US 9,698,815 B1
(45) Date of Patent: Jul. 4, 2017

(54) PIPELINED ADC WITH CONSTANT CHARGE DEMAND

(71) Applicant: STMicroelectronics SA, Montrouge (FR)

(72) Inventors: Mounir Boulemnakher, Grenoble (FR); Stephane Le Tual, St-Egreve (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 15/237,767

(22) Filed: Aug. 16, 2016

(30) Foreign Application Priority Data

Feb. 26, 2016 (FR) .................... 16 51640

(51) Int. Cl.
*H03M 1/66* (2006.01)
*H03M 1/12* (2006.01)

(52) U.S. Cl.
CPC ............. *H03M 1/66* (2013.01); *H03M 1/124* (2013.01)

(58) Field of Classification Search
CPC .......... H03M 1/00; H03M 1/403; H03M 1/66; H03M 1/124
USPC .................. 341/161, 155, 144, 172, 122
See application file for complete search history.

(56) References Cited

U.S. PATENT DOCUMENTS

| | | | |
|---|---|---|---|
| 8,451,161 B2* | 5/2013 | Buter | H03M 1/129 341/155 |
| 2005/0219097 A1 | 10/2005 | Atriss et al. | |
| 2007/0194844 A1* | 8/2007 | Signori | H03F 3/005 330/9 |
| 2008/0297243 A1* | 12/2008 | Chen | H03F 3/005 330/9 |
| 2009/0303358 A1* | 12/2009 | Kawahito | H03M 1/1245 348/255 |
| 2014/0002291 A1 | 1/2014 | Atriss et al. | |

OTHER PUBLICATIONS

Ahmed et al: "A High Bandwidth Power Scalable Sub-Sampling 10-bit Pipelined ADC With Embedded Sample and Hold," IEEE Journal of Solid-State Circuits, vol. 43, No. 7, Jul. 2008 (10 pages).
Wheeler, Ian: "A Fast Settling Reference Generator with Signal-Dependent Charge Cancellation for an 8-bit 1.5 Bit/Stage Pipelined ADC," Thesis, California State University, 2013 (83 pages).
INPI Search Report and Written Opinion for FR 1651640 dated Dec. 19, 2016 (8 pages).

* cited by examiner

*Primary Examiner* — Peguy Jean Pierre
(74) *Attorney, Agent, or Firm* — Gardere Wynne Sewell LLP

(57) ABSTRACT

A multiplying digital to analog converter includes first and second inputs for receiving first and second differential input signals. A differential amplifier has first and second differential input nodes and first and second differential output nodes. A first capacitor is coupled in series with a first switch between the first differential input node and the first input. The first capacitor is further coupled to at least one reference voltage supply node via one or more further switches. A second capacitor is coupled between the first differential input node and the first differential output node. A third capacitor is coupled between the first differential input node and the first input.

35 Claims, 7 Drawing Sheets

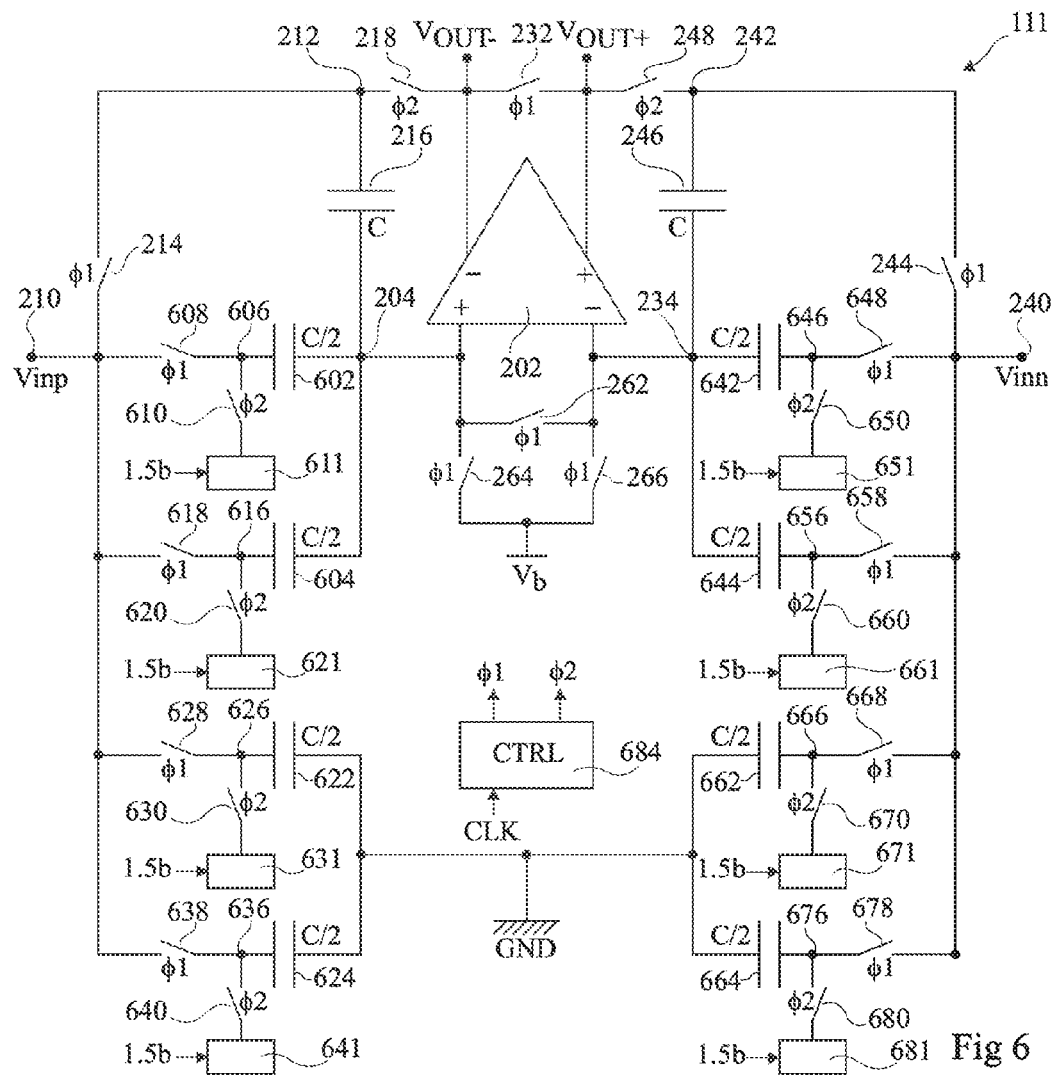
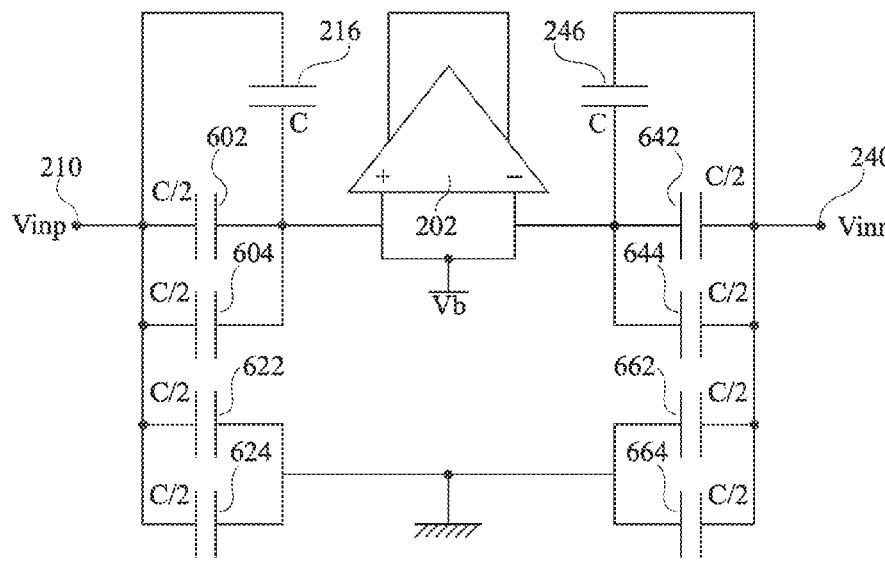
Fig 6
Fig 7A

PIPELINED ADC WITH CONSTANT CHARGE DEMAND

PRIORITY CLAIM

This application claims the priority benefit of French Application for Patent No. 1651640, filed on Feb. 26, 2016, the disclosure of which is hereby incorporated by reference in its entirety to the maximum allowable by law.

TECHNICAL FIELD

The present disclosure relates to the field of pipelined analog to digital converters (ADCs) and in particular to a pipelined ADC having constant charge demand.

BACKGROUND

A pipelined ADC (analog to digital converter) comprises a number of pipelined conversion stages. Each stage generates one or a few output bits, typically 1.5 bits, and amplifies the signal such that the next stage operates on a sub-range of the voltage range seen by the previous stage. Each stage generally comprises a flash analog to digital converter that generally compares the input signal with two or more threshold voltages to generate the output bits, and a MDAC (multiplying digital to analog converter), which converts the generated output bits back into a voltage level to be subtracted from the input voltage, the resulting residue voltage level being passed to the next stage. In particular, the MDAC generally amplifies the residue, which relaxes the noise constraints of the subsequent stages, leading to reduced power consumption and size. Advantageously, the MDAC holds the residue, meaning that the subsequent stages see a settled input.

To implement the MDAC of each stage of a pipelined converter, it has been proposed to use a switched capacitor solution according to which, during one phase, the input voltage is sampled by capacitors while the flash ADC quantizes the input voltage, and then during another phase, the residue voltage settles to its final level. In particular, the residue is generated by coupling the capacitors to one of a number of reference voltages selected based on the flash quantization.

A difficulty with such an approach is that the charge demand from the reference voltages is signal dependent. In other words, depending on the result of the flash quantization, more or less charge will be drawn from each reference voltage rail. Thus, adequate time should be left between each sampling phase to permit the reference voltages to settle back to their correct levels, as otherwise the signature left on reference voltage rails risks causing interference from one sampling phase to the next, thereby introducing errors in the generated residue voltage levels. However, providing an adequate settling time means slowing the bit rate of the converter.

SUMMARY

It is an aim of embodiments of the present disclosure to at least partially address one or more difficulties in the prior art.

According to one embodiment, there is provided a multiplying digital to analog converter (MDAC) comprising: first and second inputs for receiving first and second differential input signals; a differential amplifier having first and second differential input nodes and first and second differential output nodes; a first capacitor having one of its nodes coupled to the first differential input node and its other node coupled to the first input via a first switch and to at least one reference voltage supply node via one or more further switches; second and third capacitors, each having one of its nodes coupled to either: the first differential input node; or the first differential output node; or the first input.

According to one embodiment, the other node of the first capacitor is coupled to a first reference voltage supply node via a first further switch; the second capacitor has one of its other nodes coupled to the first differential input node and its other node coupled to the second and third reference voltage supply nodes via a first selection circuit; and the third capacitor has one of its nodes coupled to the first differential input node and its other node coupled to the second and third reference voltage supply nodes via a second selection circuit.

According to one embodiment, the MDAC further comprises a control circuit adapted to control, during a second phase: the first further switch to couple the first capacitor to the first reference voltage; the first selection circuit to couple the second capacitor to one of the second and third reference voltage supply nodes selected based on a digital conversion of the first and second differential input signals; and the second selection circuit to couple the second capacitor to one of the second and third reference voltage supply nodes selected based on said digital conversion.

According to one embodiment, the MDAC further comprising: a fourth capacitor having one of its nodes coupled to the second differential input node and its other node coupled to the second input via a first switch and to the first reference voltage via a second further switch; and fifth and sixth capacitors, wherein: the fifth capacitor has one of its other nodes coupled to the second differential input node and its other node coupled to the second and third reference voltages via a third selection circuit; and the sixth capacitor has one of its nodes coupled to the second differential input node and its other node coupled to the second and third reference voltages via a fourth selection circuit.

According to one embodiment, the second capacitor has one of its nodes coupled to the first reference voltage supply node, and its other node coupled to either the first input or the first differential output node; and the third capacitor has one of its nodes coupled to the first reference voltage supply node and its other node coupled to either the first input or the first differential output node.

According to one embodiment, the first capacitor has its other node coupled to at least one reference voltage supply rail via a fifth selection circuit, the MDAC further comprising: a seventh capacitor having one of its nodes coupled to the first differential input node and its other node coupled to the first input via a second switch and to at least one reference voltage supply node via a sixth selection circuit.

According to one embodiment, the second capacitor has one of its nodes coupled to the first reference voltage rail, and its other node coupled to the first input via a third switch and to the second and third reference voltage supply nodes via a seventh selection circuit; and the third capacitor has one of its nodes coupled to the first reference voltage supply node, and its other node coupled to the first input via a fourth switch and to the second and third reference voltage supply nodes via an eighth selection circuit.

According to one embodiment, the MDAC further comprises a control circuit adapted to: control, during a first phase, the first, second, third and fourth switches to couple the first, second, third and seventh capacitors to the first input; and control, during a second phase, the fifth, sixth, seventh and eighth selection circuits to couple each of the first, second, third and seventh capacitors to one of first, second and third reference voltage supply nodes based on a digital conversion of the first and second differential input signals.

According to one embodiment, the MDAC further comprises: an eighth capacitor having one of its nodes coupled to the second differential input node and its other node coupled to the second input via a fifth switch and to at least one reference voltage supply node via one or more further switches; a ninth capacitor having one of its nodes coupled to the second differential input node and its other node coupled to the second input via a sixth switch and to at least one reference voltage supply node via one or more further switches; a tenth capacitor having one of its nodes coupled to the first reference voltage supply node, and its other node coupled to the second input via a seventh switch and to the second and third reference voltage supply nodes via a ninth selection circuit; and an eleventh capacitor having one of its nodes coupled to the first reference voltage supply node, and its other node coupled to the second input via an eighth switch and to the second and third reference voltage supply nodes via a tenth selection circuit.

According to one embodiment, the second capacitor has one of its nodes coupled to a first reference voltage supply node, and its other node coupled to the first differential output node and to second and third reference voltage supply nodes via a seventh selection circuit; and the third capacitor has one of its nodes coupled to the first reference voltage supply node, and its other node coupled to the first differential output node and to the second and third reference voltage supply nodes via an eighth selection circuit.

According to one embodiment, the MDAC further comprises a control circuit further adapted to: control, during an initial phase, the one or more further switches to couple the first and seventh capacitors to the first input and the sixth and seventh selection circuits to couple the second and third capacitors to the first reference voltage.

According to one embodiment, the MDAC further comprises an eighth capacitor having one of its nodes coupled to the second differential input node and its other node coupled to the second input via a fifth switch and to at least one reference voltage supply node via one or more further switches; a ninth capacitor having one of its nodes coupled to the second differential input node and its other node coupled to the second input via a sixth switch and to at least one reference voltage supply node via one or more further switches; a tenth capacitor having one of its nodes coupled to the first reference voltage supply node, and its other node coupled to the second differential output node via a seventh switch and to the second and third reference voltage supply nodes via a ninth selection circuit; and an eleventh capacitor having one of its nodes coupled to the first reference voltage supply node, and its other node coupled to the second differential output node via an eighth switch and to the second and third reference voltage supply nodes via a tenth selection circuit.

According to one embodiment, the first, second, third and seventh capacitors each have half the capacitance of a twelfth capacitor coupled between the differential input and output nodes of the differential amplifier.

According to a further aspect, there is provided a pipelined analog to digital converter comprising a plurality of conversion stages coupled in a pipeline, each conversion stage comprising the above MDAC, and an r-bit analog to digital converter adapted to generate r bits based on the output signals of a last of the plurality of conversion stages.

BRIEF DESCRIPTION OF THE DRAWINGS

The foregoing and other features and advantages will become apparent from the following detailed description of embodiments, given by way of illustration and not limitation with reference to the accompanying drawings, in which:

FIG. 6 schematically illustrates an MDAC of the pipelined ADC of FIG. 1 in more detail according to a further example embodiment of the present disclosure;

FIGS. 7A and 7B represent operating phases of the MDAC of FIG. 6 according to an example embodiment of the present disclosure;

DETAILED DESCRIPTION

Throughout the present disclosure, the term "connected" is used to designate a direct electrical connection from one element to another, whereas the term "coupled" is used to designate an electrical connection that may be direct, or may be via one or more further components such as resistors, capacitors or switches. The term "substantially" is used to signify a tolerance of plus or minus 10 percent of the value in question.

Figure 1:
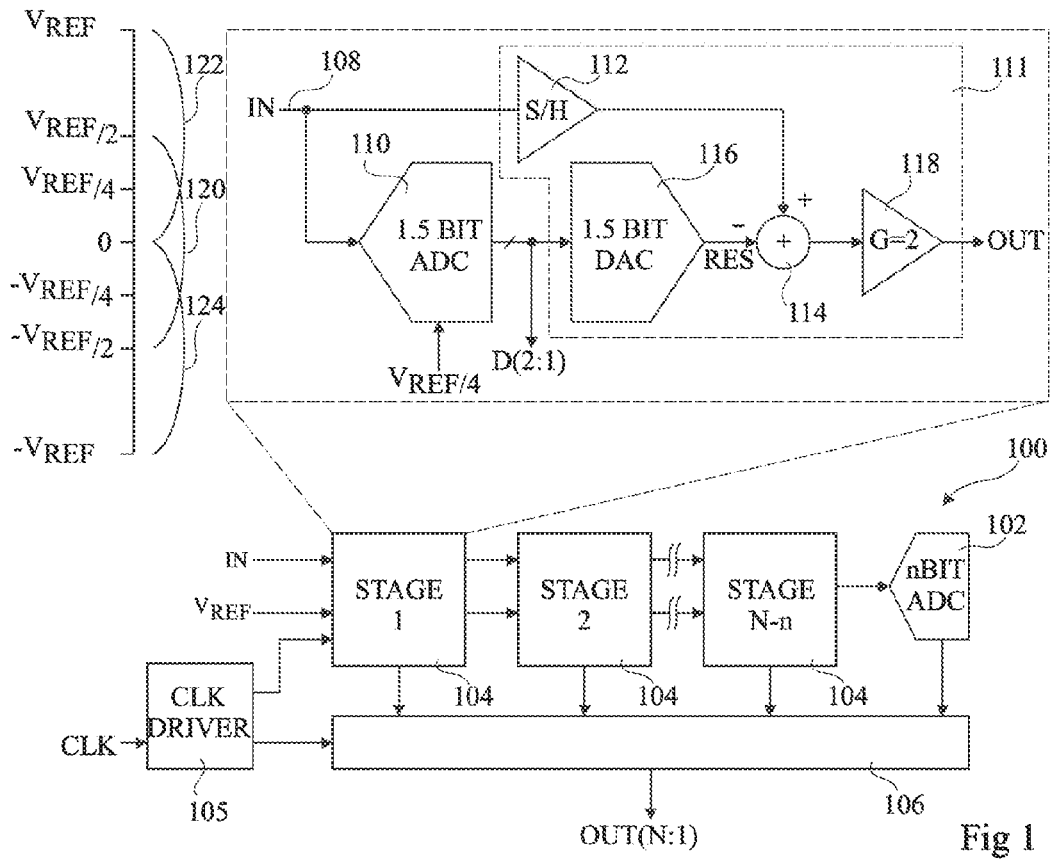
FIG. 1 schematically illustrates a pipelined ADC according to an example embodiment.

FIG. 1 schematically illustrates a pipelined N-bit ADC 100 according to an example embodiment. The pipelined ADC 100 for example comprises an n-bit ADC (nBIT ADC) 102, and N-n pipelined conversion stages (STAGE 1, STAGE 2, STAGE N-n) 104 coupled in series and generating the input signal of the n-bit ADC 102.

A first of the conversion stages 104 for example receives an analog input signal IN to be converted, and a reference voltage $V_{REF}$, and generates one or more output bits and an output analog signal to serve as the input signal IN of the subsequent stage. Each subsequent stage 104 comprises a similar circuit. A clock driver (CLK DRIVER) 105 for example receives a clock signal CLK, and generates timing signals for driving the stages of the pipelined ADC and also for driving an error correction and output register 106. The register 106 for example receives the one or more output bits generated by each of the conversion stages 104 and by the ADC 102 of the pipelined ADC 100, and generates, based on these bits, the N-bit digital output signal OUT(N:1) of the converter.

In one embodiment, each conversion stage has a 1.5-bit flash ADC, and thus provides 1.5 bits of output data to the error correction and output register 106. After error correction, the N-n stages of the pipeline for example generate N-n bits of output data. Thus, in an example of a 12-bit converter, there are for example 11 stages 104, and a final 1-bit ADC 102. An example implementation of the first of the conversion stages 104 is illustrated in FIG. 1. The other conversion stages for example comprise similar circuits.

The input line receiving the input signal IN is labeled 108 and is coupled to a flash ADC 110, which for example compares the input signal with first and second thresholds equal to $+V_{REF}/4$ and $-V_F/4$ in order to generate a 1.5 bit output signal D(2:1). The input line 108 is also for example coupled to an MDAC 111, which also receives the output bits from the flash ADC 110, and generates an output signal OUT forming the input signal of the next stage. The MDAC 111 for example comprises a sample and hold circuit (S/H) 112, which samples the input signal, and provides the result to an adder 114. The adder 114 subtracts, from this signal, a residue value generated by a 1.5 bit DAC 116 based on the output bits generated by the flash ADC 110. The output of the adder 114 is amplified by an amplifier 118, for example having a gain of 2, to generate the output signal OUT.

Operation of the stage is for example as follows. It is assumed that the input signal IN of the stage is a differential input signal having components Vinp and Vinn. Each of the stages 104 compares the input signal with threshold voltages equal to $+V_{REF}/4$ and $-V_{REF}/4$. The 1.5-bit flash ADC of each stage will compare the input voltages with these threshold voltages.

As illustrated on the left-hand side of FIG. 1, if the signals Vinp and Vinn are between these threshold voltages, it is assumed that the input signal must lie within a central portion 120 between $V_{REF}/2$ and $-V_{REF}/2$, and thus a gain of 2 is applied to this portion of the input signal, and the result is provided to the next stage. For this, the output analog voltages are for example equal to 2Vinp and 2Vinn respectively.

Alternatively, if the flash ADC finds that Vinp is greater than $V_{REF}/4$ and Vinn is less than $-V_{REF}/4$, it is assumed that the input signal must lie within an upper portion 122 between 0 V and $+V_{REF}$, and thus a gain of 2 is applied to this portion of the input signal, and the result is provided to the next stage. For this, the output analog voltages are for example equal to 2Vinp$-V_{REF}$ and 2Vinn$+V_{REF}$ respectively.

Alternatively, if the flash ADC finds that Vinp is less than $-V_{REF}/4$ and Vinn is greater than $V_{REF}/4$, it is assumed that the input signal must lie within a lower portion 124 between $-V_{REF}$ and 0 V, and thus a gain of 2 is applied to this portion of the input signal, and the result is provided to the next stage. For this, the output analog voltages are for example equal to 2Vinp$+V_{REF}$ and 2Vinn$-V_{REF}$ respectively.

An advantage of implementing the pipeline stages in this way is that it provides a high tolerance against incorrect quantization by the flash ADC, and thus the flash ADC can have relatively low precision.

While in the example of FIG. 1 the flash ADC 110 is coupled directly to the input line receiving the analog input signal IN, in alternative embodiments it could be coupled to the output of the sample and hold circuit 112. Such an implementation is for example described in more detail in the publication by I. Ahmed et al. entitled "A High Bandwidth Power Scalable Sub-Sampling 10-bit Pipelined ADC With Embedded Sample and Hold", IEEE journal of solid-state circuits, Vol. 43, No. 7, July 2008, the contents of which is hereby incorporated by reference to the extent permitted by the law. An example implementation of the MDAC 111 of FIG. 1 modified to be based on such an approach will now be described with reference to FIG. 2.

Figure 2:
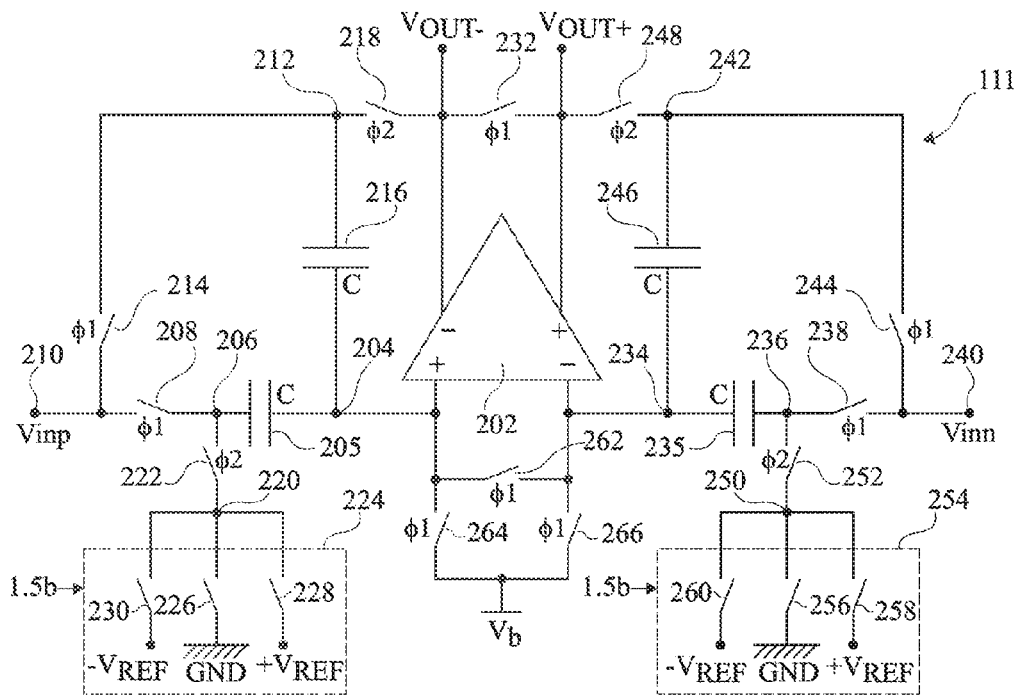
FIG. 2 schematically illustrates a multiplying digital to analog converter (MDAC) of a conversion stage of FIG. 1 in more detail according to an example embodiment.

FIG. 2 schematically illustrates the MDAC 111 of the converter stage of FIG. 1 in more detail according to an example embodiment in which the input and output signals IN, OUT are differential signals. The MDAC 111 for example comprises a differential amplifier 202 having differential inputs and outputs.

The positive input of the differential amplifier 202 is coupled to a node 204. A capacitor 205 is coupled between the node 204 and a further node 206. The node 206 is coupled via a switch 208 to an input node 210 of the MDAC 111 for receiving a component Vinp of the differential input signal IN. The input node 210 is also coupled to a further node 212 via a switch 214. A further capacitor 216 is coupled between the nodes 212 and 204. The node 212 is further coupled to the negative output of the differential amplifier 202 via a switch 218. The node 206 is for example coupled to a node 220 via a switch 222. The node 220 is coupled to three reference levels $-V_{REF}$, ground and +VREF via a selection circuit 224, which selects one of the reference voltages based on the 1.5 bit signal generated by the ADC 110 of FIG. 1. For example, the selection circuit 224 comprises a switch 226 coupled between the node 220 and ground, a switch 228 coupled between the node 220 and the reference voltage rail $+V_{REF}$ and a switch 230 coupled between the node 220 and the reference voltage rail $-V_{REF}$.

The positive and negative outputs of the differential amplifier 202 are for example coupled together via a further switch 232.

The negative input of the differential amplifier 202 is coupled to a node 234. A capacitor 235 is coupled between the node 234 and a further node 236. The node 236 is coupled via a switch 238 to an input node 240 of the MDAC 111 for receiving a component Vinn of the differential input signal IN. The input node 240 is also coupled to a further node 242 via a switch 244. A further capacitor 246 is coupled between the nodes 242 and 234. The node 242 is further coupled to the positive output of the differential amplifier 202 via a switch 248. The node 236 is for example coupled to a node 250 via a switch 252. The node 250 is coupled to the three reference levels $-V_{REF}$, ground and +VREF via a selection circuit 254, which selects one of the reference voltages based on the 1.5 bit signal generated by the ADC 110 of FIG. 1. For example, the selection circuit 254 comprises a switch 256 coupled between the node 250 and ground, a switch 258 coupled between the node 250 and the reference voltage rail $+V_{REF}$ and a switch 260 coupled between the node 250 and the reference voltage rail $-V_{REF}$.

The differential input nodes 204, 234 of the amplifier 202 are for example coupled together by a switch 262. Furthermore, the positive input node 204 is for example coupled to a reference voltage supply node $V_b$ via a switch 264, and the negative input node 234 is for example coupled to the reference voltage supply node $V_b$ via a switch 266. The voltage $V_b$ is for example at the ground level, although it could be at a different level.

The capacitors 205, 235, 216 and 246 all for example have capacitances C that are substantially equal.

The switches 208, 238, 214, 244, 232, 262, 264 and 266 are for example controlled by a phase signal $\phi 1$, although in some embodiments the switches 262, 264 and 266 may be rendered non-conductive just before the switches 208 and 238. The switches 218, 248, 222 and 252 are for example controlled by a phase signal $\phi 2$.

The selection circuits 224, 254 are for example controlled by the flash ADC 110, which for example has its inputs coupled to the outputs $V_{OUT+}$ and $V_{OUT-}$ of the differential amplifier 202.

Operation of the circuit of FIG. 2 will now be described in more detail in reference to FIGS. 3A and 3B.

Figure 3A:
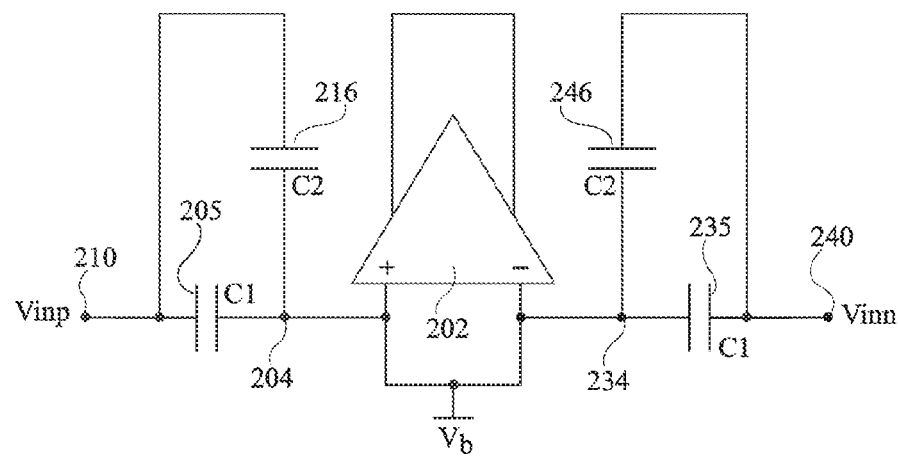
FIGS. 3A and 3B represent operating phases of the MDAC of FIG. 2 according to an example embodiment.

FIG. 3A represents the connection of the MDAC 111 of FIG. 2 during a phase in which the signal φ1 and not the signal φ2 is asserted. Thus the positive input of the differential amplifier 202 is coupled to the input node 210 via the parallel connection of the capacitors 205 and 216. Similarly, the negative input of the differential amplifier 202 is coupled to the input node 240 via the parallel connection of the capacitors 235 and 246. The inputs of the differential amplifier are also for example coupled to the reference voltage supply node $V_b$. The outputs of the differential amplifier 202 are coupled together, thereby resetting the output of the differential amplifier 202 to the common mode level.

Figure 3B:
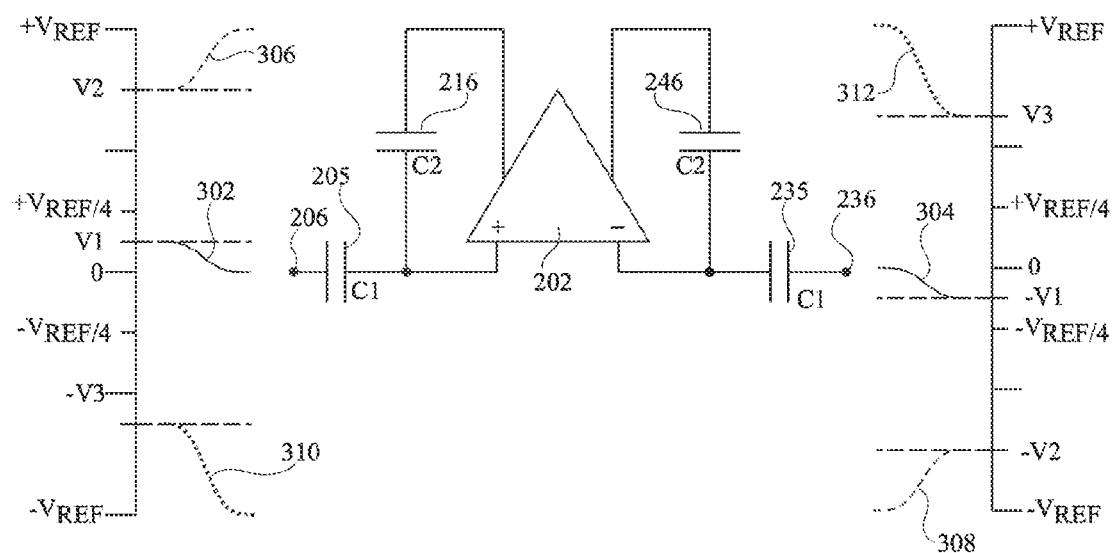

FIG. 3B represents the connection of the MDAC 111 of FIG. 2 during a phase in which the signal φ2 and not the signal φ1 is asserted. Thus the outputs of the differential amplifier 202 are coupled via the capacitors 216 and 246 to the respective inputs of the differential amplifier 202. Furthermore, the capacitors 205 and 235 are coupled, via the selection circuits 224, 254 (not illustrated in FIG. 3B) to one of the reference voltages selected based on the level of the input signal. For example: if the input signals Vinp and Vinn are between $-V_{REF}/4$ and $+V_{REF}/4$, the capacitors 205 and 235 are coupled to the ground voltage; if the input signal Vinp is higher than $+V_{REF}/4$ and the input signal Vinn is lower than $-V_{REF}/4$, the capacitor 205 is coupled to $+V_{REF}$ and the capacitor 235 is coupled to $-V_{REF}$; and if the input signal Vinp is lower than $-V_{REF}/4$ and the input signal Vinn is higher than $V_{REF}/4$, the capacitor 205 is coupled to $-V_{REF}$ and the capacitor 235 is coupled to $+V_{REF}$.

On the left-hand side and right-hand side in FIG. 3B examples of the connections of the nodes 206 and 236 respectively are illustrated.

According to one example, as illustrated by solid curves 302 and 304, the input signal Vinp is at a level V1 between 0 and $V_{REF}/4$ and the node 206 is thus coupled to ground, and the input signal Vinn is at a level −V1 between 0 and $-V_F/4$ and the node 236 is thus also coupled to ground. In this example, the MDAC generates the signals 2Vinp and 2Vinn at its output nodes. The charge demand on the ground supply rails and on the supply rails $+V_{REF}$, $-V_{REF}$ is for example zero in this case.

According to another example, as illustrated by dashed curves 306 and 308, the input signal Vinp is at a level V2 between $V_{REF}/4$ and $V_{REF}$, and the node 206 is thus coupled to $V_{REF}$, and the input signal Vinn is at a level −V2 between $-V_{REF}/4$ and $-V_{REF}$, and the node 236 is thus coupled to $-V_{REF}$. In this example, the MDAC generates the signals 2Vinp−$V_{REF}$ and 2Vinn+$V_{REF}$, and there will thus be a positive charge demand on the supply voltage rail $+V_{REF}$ based on the signal Vinp and a negative charge demand on the supply voltage rail $-V_{REF}$ based on the signal Vinn.

According to yet another example, as illustrated by dotted curves 310 and 312, the input signal Vinp is at a level −V3 between $-V_{REF}/4$ and $-V_{REF}$, and the node 206 is thus coupled to $-V_{REF}$, and the input signal Vinn is at a level V3 between $V_{REF}/4$ and $V_{REF}$, and the node 236 is thus coupled to $+V_{REF}$. In this example, the MDAC generates the signals 2Vinp+$V_{REF}$ and 2Vinn−$V_{REF}$, and there will thus be a positive charge demand on the supply voltage rail $+V_{REF}$ based on the signal Vinn and a negative charge demand on the supply voltage rail $-V_{REF}$ based on the signal Vinp.

Thus it can be seen that in such a circuit, the charge demand on the reference voltage rails $+V_{REF}$ and $-V_{REF}$, is dependent on the level of the input signal, leading to the drawbacks described above in the background section. For example, the input dependent charge demand can be calculated as follows for the three voltage cases of FIG. 3B:

the V1 case: $\Delta Q$ (GND left)$=-(0-V1)\cdot C=V1\cdot C$
$\Delta Q$ (GND right)$=-(0-(-V1))\cdot C=-V1\cdot C$
thus: $\Sigma\Delta Q$ (GND)$=V1\cdot C-V1\cdot C=0$
$\Sigma\Delta Q$ (+VREF)$=0$ and
$\Sigma\Delta Q$ (−VREF)$=0$
the V2 case: $\Delta Q$ (+VREF)$=-(+VREF-V2)\cdot C$
$\Delta Q$ (−VREF)$=(VREF-V2)\cdot C=-\Delta Q$ (+VREF) and
$\Delta Q$ (GND)$=0$
the V3 case: $\Delta Q$ (+VREF)$=-(+VREF-V3)\cdot C$
$\Delta Q$ (−VREF)$=(VREF-V3)\cdot C=-\Delta Q$ (+VREF)
$\Delta Q$ (GND)$=0$ FIG. 4 schematically illustrates a circuit implementing the MDAC 111 of FIG. 1 in more detail according to an alternative example embodiment to that of FIG. 2.

Figure 4:
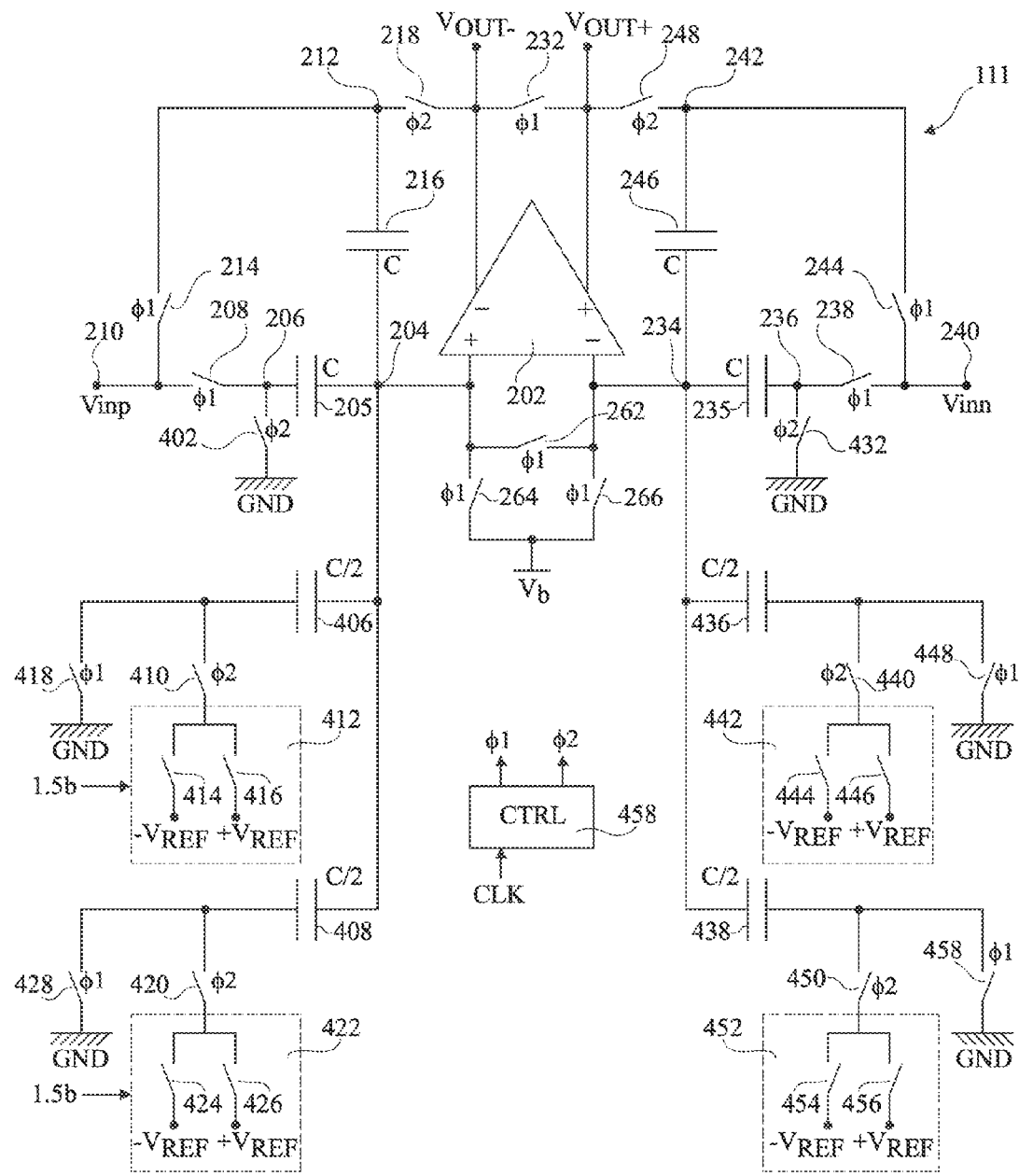
FIG. 4 schematically illustrates an MDAC of the pipelined ADC of FIG. 1 in more detail according to an example embodiment of the present disclosure.

In FIG. 4, elements which are the same as those in the circuit of FIG. 2 have been labeled like reference numerals and will not be described again in detail.

In the embodiment of FIG. 4, the circuitry coupled to the positive input node 204 of the differential amplifier 202 is modified as follows with respect to the circuit of FIG. 2.

The selection circuit 224 is replaced by a switch 402, coupling the node 206 to ground. Furthermore, a pair of additional capacitors 406, 408 are for example provided, each having one of its nodes coupled to the positive input node 204 of the differential amplifier 202. The capacitors 406, 408 each for example have a capacitance of substantially half the capacitance C of the capacitor 205.

The capacitor 406 has its other node coupled via a switch 410 to a selection circuit 412. The selection circuit 412 for example permits one of the reference voltages $+V_{REF}$ and $-V_{REF}$ to be selected and coupled to the capacitor 406, the selection being based on the 1.5-bit output signal from the flash ADC. For example, the selection circuit 412 comprises a switch 414 coupled between the switch 410 and the reference voltage rail $-V_{REF}$ and a switch 416 coupled between the switch 410 and the reference voltage rail $+V_{REF}$. A further switch 418 is for example coupled between the capacitor 406 and the ground voltage rail.

Similarly, the capacitor 408 has its other node coupled via a switch 420 to a selection circuit 422. The selection circuit 422 for example permits one of the reference voltages $+V_{REF}$ and $-V_{REF}$ to be selected and coupled to the capacitor 408, the selection being based on the 1.5-bit output signal from the flash ADC. For example, the selection circuit 422 comprises a switch 424 coupled between the switch 420 and the reference voltage rail $-V_{REF}$ and a switch 426 coupled between the switch 420 and the reference voltage rail $+V_{REF}$. A further switch 428 is for example coupled between the capacitor 408 and the ground voltage rail.

Similarly, the circuitry coupled to the negative input node 234 of the differential amplifier 202 is modified as follows with respect to the circuit of FIG. 2.

The selection circuit 254 is replaced by a switch 432, coupling the node 236 to ground. Furthermore, a pair of additional capacitors 436, 438 are for example provided, each having one of its nodes coupled to the negative input node 234 of the differential amplifier 202. The capacitors 436, 438 each for example have a capacitance of substantially half the capacitance C of the capacitor 235.

The capacitor 436 has its other node coupled via a switch 440 to a selection circuit 442. The selection circuit 442 for example permits one of the reference voltages $+V_{REF}$ and $-V_{REF}$ to be selected and coupled to the capacitor 436, the selection being based on the 1.5-bit output signal from the flash ADC. For example, the selection circuit 442 comprises a switch 444 coupled between the switch 440 and the reference voltage rail $-V_{REF}$ and a switch 446 coupled between the switch 440 and the reference voltage rail $+V_{REF}$. A further switch 448 is for example coupled between the capacitor 436 and the ground voltage rail.

Similarly, the capacitor 438 has its other node coupled via a switch 450 to a selection circuit 452. The selection circuit 452 for example permits one of the reference voltages $+V_{REF}$ and $-V_{REF}$ to be selected and coupled to the capacitor 438, the selection being based on the 1.5-bit output signal from the flash ADC. For example, the selection circuit 452 comprises a switch 454 coupled between the switch 450 and the reference voltage $-V_{REF}$ and a switch 456 coupled between the switch 450 and the reference voltage $+V_{REF}$. A further switch 458 is for example coupled between the capacitor 438 and the ground voltage rail.

The switches 402, 410, 420, 432, 440 and 450 are for example controlled by the phase signal φ2. The switches 418, 428, 448 and 458 are for example controlled by the phase signal φ1. The phase signals φ1 and φ2 are for example generated by a control circuit 458 based on a clock signal CLK.

In operation, during a first phase, the MDAC of FIG. 4 is for example adapted to couple the input voltages Vinp, Vinn, to the capacitors 205, 216, 235 and 246, in a similar manner to what is shown in FIG. 3A described above. During this phase, the capacitors 406, 408, 436 and 438 are for example coupled to ground via the switches 418, 428, 448 and 458 respectively. A second phase is illustrated in FIG. 5.

Figure 5:
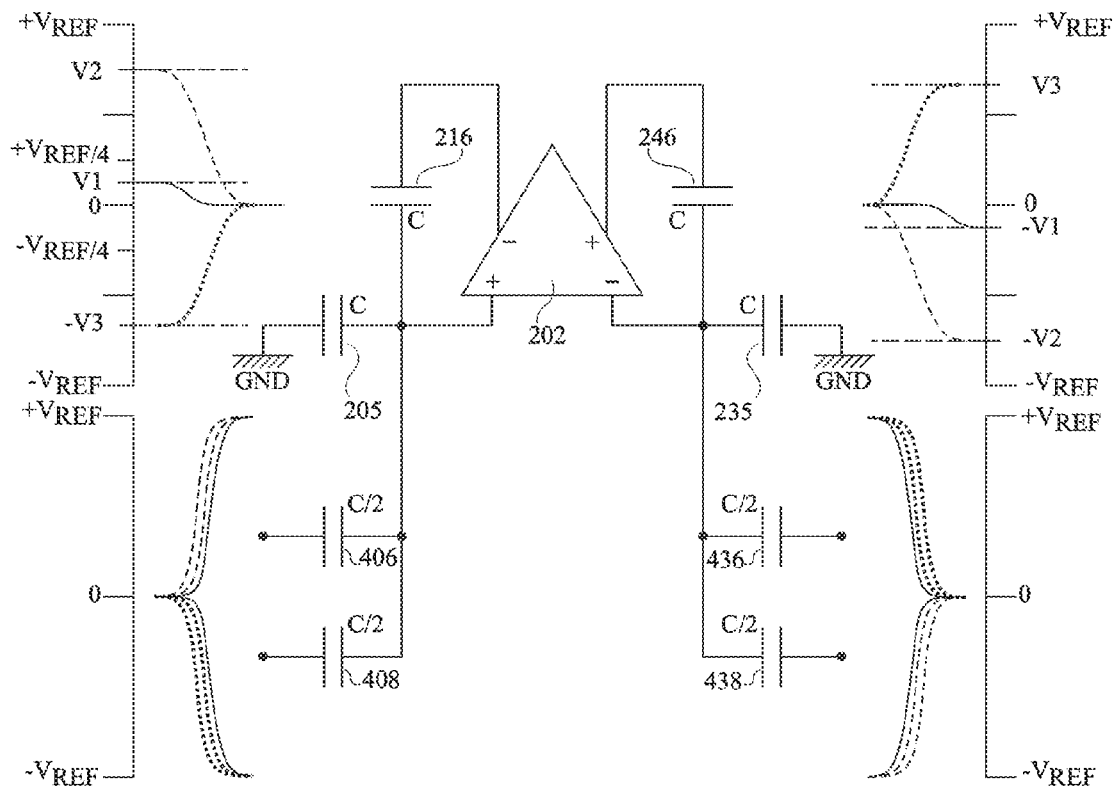
FIG. 5 represents an operating phase of the MDAC of FIG. 2 according to an example embodiment.

FIG. 5 represents an operating phase of the MDAC of FIG. 4 in which the capacitors 216, 246 are coupled in feedback paths between the output/input nodes of the differential amplifier 202, the capacitors 205, 235 are coupled via the switches 402, 432 to ground, and the capacitors 406, 408, 436, 438 are each coupled to one of the reference voltage rails based on the result of the flash ADC conversion.

On the left-hand side and right-hand side in FIG. 5, some examples of the input voltages Vinp and Vinn are illustrated at the same levels V1, V2 and V3 as in the example of FIG. 3B. As represented by solid curves, in the case that the input voltage Vinp is at a level V1 between $-V_{REF}/4$ and $+V_F/4$, the capacitors 406 and 436 are for example coupled to the supply rail $+V_{REF}$ and the capacitors 408, 438 are for example coupled to the supply rail $-V_{REF}$; as represented by dashed curves, if the input signal Vinp is at a level V2 higher than $+V_{REF}/4$ and the input signal Vinn is at a level $-V2$ lower than $-V_{REF}/4$, both capacitors 406, 408 are for example coupled to the supply rail $+V_{REF}$, and both capacitors 436, 438 are for example coupled to the supply rail $-V_{REF}$; and as represented by dotted curves, if the input signal Vinp is at a level $-V3$ lower than $-V_{REF}/4$ and the input signal Vinn is at a level V3 higher than $V_{REF}/4$, both of the capacitors 406, 408 are for example coupled to the supply rail $-V_{REF}$ and both of the capacitors 436, 438 are for example coupled to the supply rail $+V_{REF}$.

An advantage of the embodiment of the MDAC of FIG. 4 is that the charge demand on the reference voltage rails $-V_{REF}$ and $+V_{REF}$ and on the ground voltage rail is constant irrespective of the levels of the input signals Vinp, Vinn. For example, the charge demand can be calculated as follows for the supply voltage rails GND, $+V_{REF}$ and $-V_{REF}$:

charge demand on GND rail is always null:
ΣΔQ(GND left and right)=−(0−V)·C−(0−(−V))·C=0;
charge demand on +VREF: ΣΔQ (+VREF left and right)=−2(+VREF−0);
charge demand on −VREF: ΣΔQ (−VREF left and right)=−2(−VREF−0).

FIG. 6 illustrates the MDAC 111 of FIG. 1 according to an alternative example embodiment to that of FIG. 4. The circuit of FIG. 6 is similar to the circuit of FIG. 2, and like features have been labeled with like reference numerals and will not be described again in detail.

In the embodiment of FIG. 6, the capacitor 205 is replaced by a pair of capacitors 602 and 604 each having a capacitance C/2, in other words a capacitance of substantially half the capacitance C of the capacitor 216. The capacitor 602 is coupled between the node 204 and a node 606, which is in turn coupled to the input node 210 via a switch 608 controlled by the phase signal φ1. The node 606 is also coupled via a switch 610 to a selection circuit 611, which is for example similar to the selection circuit 412 of FIG. 4. The capacitor 604 is coupled between the node 204 and a node 616, which is in turn coupled to the input node 210 via a switch 618 controlled by the phase signal φ1. The node 616 is also coupled via a switch 620 to a selection circuit 621, which is also similar to the selection circuit 412 of FIG. 4. The switches 610 and 620 are for example controlled by the phase signal φ2.

The circuit of FIG. 6 further comprises a dummy load on the input node 210 formed by a further pair of capacitors 622, 624, as will now be described. The capacitor 622 has a capacitance substantially equal to C/2 and is for example coupled between ground and a node 626. The node 626 is for example coupled to the input node 210 via a switch 628, and via a switch 630 to a selection circuit 631, which is similar to the selection circuit 412 or 442 of FIG. 4. The capacitor 624 has a capacitance substantially equal to C/2 and is for example coupled between ground and a node 636. The node 636 is for example coupled to the input node 210 via a switch 638, and via a switch 640 to a selection circuit 641, which is similar to the selection circuit 412 or 422 of FIG. 4. The switches 628 and 638 are for example controlled by the phase signal φ1 and the switches 630 and 640 are for example controlled by the phase signal φ2.

Similarly, the capacitor 235 is replaced by a pair of capacitors 642 and 644 each having a capacitance C/2, in other words a capacitance of substantially half the capacitance C of the capacitor 246. The capacitor 642 is coupled between the node 234 and a node 646, which is in turn coupled to the input node 240 via a switch 648 controlled by the phase signal φ1. The node 646 is also coupled via a switch 650 to a selection circuit 651, which is for example similar to the selection circuit 412 of FIG. 4. The capacitor 644 is coupled between the node 234 and a node 656, which is in turn coupled to the input node 240 via a switch 658 controlled by the phase signal φ1. The node 656 is also coupled via a switch 660 to a selection circuit 661, which is also for example similar to the selection circuit 412 of FIG. 4. The switches 650 and 660 are for example controlled by the phase signal φ2.

The circuit of FIG. 6 further comprises a dummy load on the input node 240 formed by a further pair of capacitors 662 and 664, as will now be described. The capacitor 662 has a capacitance substantially equal to C/2 and is for example coupled between ground and a node 666. The node 666 is for example coupled to the input node 240 via a switch 668, and via a switch 670 to a selection circuit 671, which is similar to the selection circuit 412 or 442 of FIG. 4. The capacitor 664 has a capacitance substantially equal to C/2 and is for example coupled between ground and a node 676. The node 676 is for example coupled to the input node 240 via a switch 678, and via a switch 680 to a selection circuit 681, which is similar to the selection circuit 412 or 442 of FIG. 4. The switches 668 and 678 are for example controlled by the phase signal φ1 and the switches 670 and 680 are for example controlled by the phase signal φ2. The phase signals φ1 and φ2 are for example generated by a control circuit 684 based on a clock signal CLK.

Operation of the circuit of FIG. 6 will now be described in more detail with reference to FIGS. 7A and 7B.

FIG. 7A illustrates a first phase in which the phase signal φ1 is asserted such that the capacitors 216, 602 and 604 are coupled in parallel between the positive input of the differential amplifier 202 and the input node 210. Similarly, the capacitors 246, 642 and 644 are coupled between the negative input of the differential amplifier 202 and the input node 240. Furthermore, the capacitors 622 and 624 are coupled in parallel between ground and the input node 210, and the capacitors 662 and 664 are coupled in parallel between ground and the input node 240. Thus, during this phase, the dummy load formed by the capacitors 622, 624, 662 and 664 is coupled to the input nodes 210, 240 and charged based on the input signals Vinp, Vinn in a similar fashion to the capacitors 602, 604, 642 and 644.

Figure 7B:
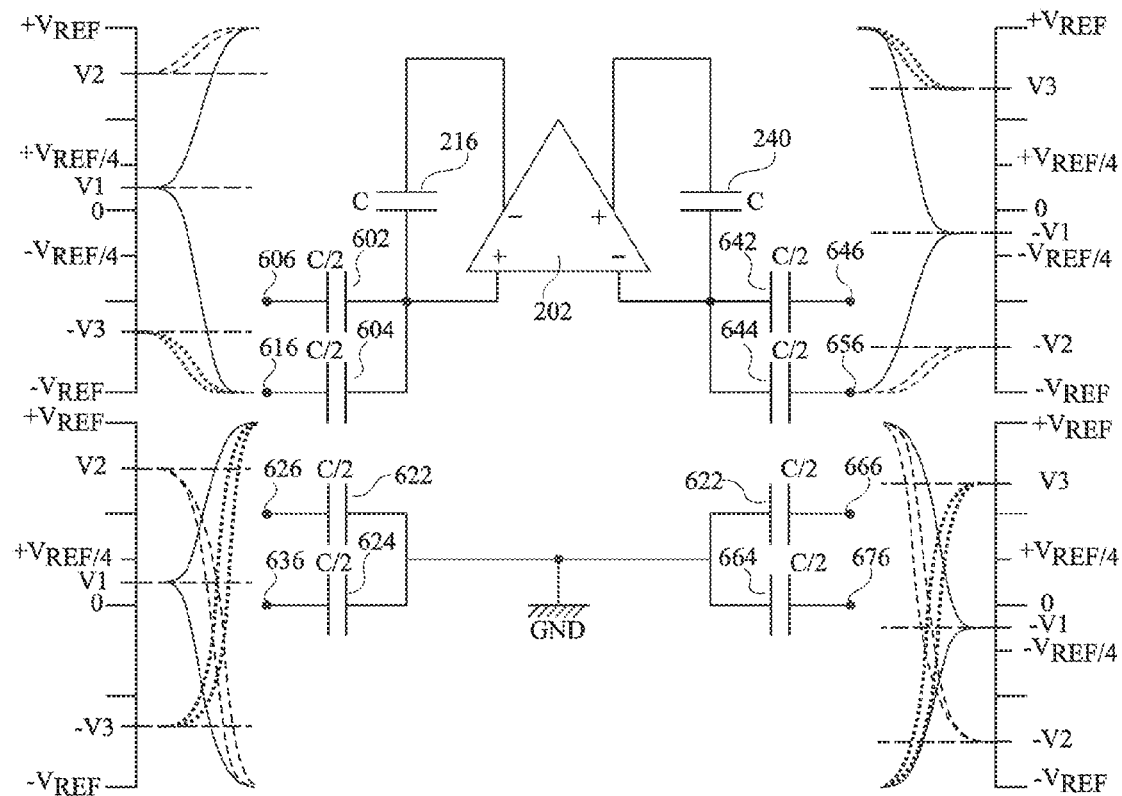

FIG. 7B illustrates a phase in which the phase signal φ2 is asserted such that the capacitors 216 and 246 are coupled between the inputs and outputs of the differential amplifier 202. Furthermore, the nodes 606, 616, 626, 636, 646, 656, 666 and 676 are coupled via the corresponding selection circuits (not illustrated in FIG. 7B) to one of the reference voltages based on the input data signal. For example: if the input signals Vinp and Vinn are between $-V_{REF}/4$ and $+V_F/4$, the nodes 606, 626, 646 and 666 are coupled to $+V_{REF}$ and the nodes 616, 636, 656 and 676 are coupled to $-V_{REF}$; if the input signal Vinp is higher than $+V_{REF}/4$ and the input signal Vinn is lower than $-V_{REF}/4$, the nodes 606, 616, 666 and 676 are coupled to $+V_{REF}$, and the nodes 626, 636, 646 and 656 are coupled to $-V_{REF}$; and if the input signal Vinp is lower than $-V_{REF}/4$ and the input signal Vinn is higher than $V_{REF}/4$, the nodes 606, 616, 666 and 676 are coupled to $-V_{REF}$ and the nodes 626, 636, 646 and 656 are coupled to $+V_{REF}$.

On the left-hand side and right-hand side in FIG. 7B, some examples of the voltages applied to the nodes 606, 616, 626, 636, 646, 656, 666 and 676 are illustrated in the case that the input signals Vinp, Vinn are at the same levels V1, V2 and V3 as in the example of FIG. 3B. It can be seen that, irrespective of the level of the input signal, there will be a constant charge demand on the reference voltage rails $-V_{REF}$ and $+V_{REF}$ and on the ground voltage rail. For example, the charge demand can be calculated as follows for the supply voltage rails GND, $+V_{REF}$ and $-V_{REF}$:

charge demand on GND rails is always null, as GND is not used at all in this embodiment;

charge demand on +VREF:

Case V1: $\Sigma\Delta Q(+VREF)=$
$-(+VREF-V1)\cdot C-(+VREF-(-V1))\cdot C-(+VREF-V1)\cdot C-(+VREF-V1)\cdot C=-4\cdot VREF\cdot C$ Case V2: $\Sigma\Delta Q$ $(+VREF)=-2\cdot(+VREF-V2)\cdot C-2\cdot(+VREF-(-V2))\cdot c=-4\cdot VREF\cdot C$ Case V3: $\Sigma\Delta Q$ $(+VREF)=-2\cdot(+VREF-V3)\cdot C-2\cdot(+VREF-(-V3))\{fourth\ root\}C=-4\cdot VREF\cdot C$ it can be calculated similarly that the charge demand on $-VREF$ is constant and equal to $4\cdot VREF\cdot C$ whatever the case.

An advantage of the embodiment of FIG. 6 with respect to that of FIG. 4 is that the dummy capacitors 622, 624, 662 and 664 do not add to the capacitance of the input nodes of the differential amplifier 202, meaning that the feedback factor will not be affected.

Figure 8A:
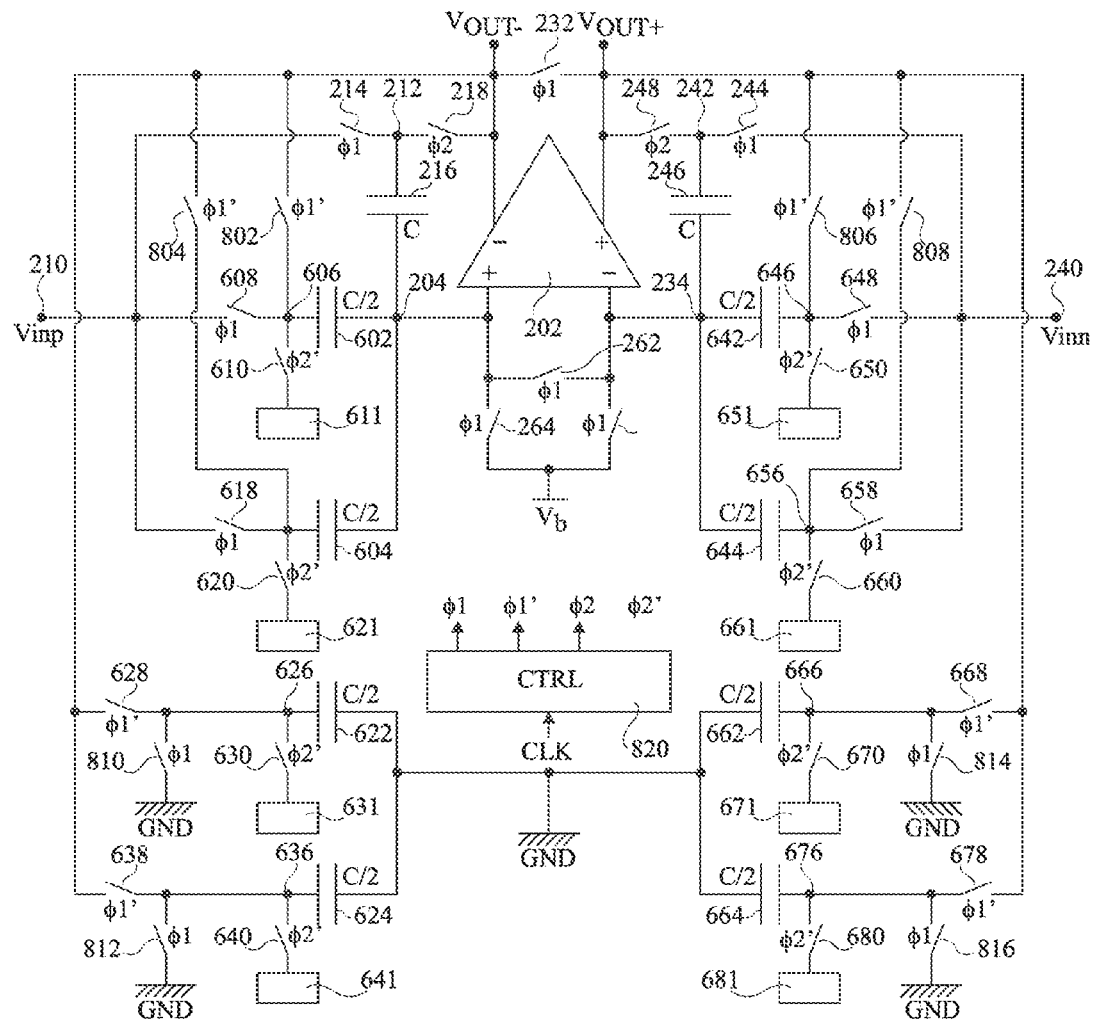
FIG. 8A schematically illustrates an MDAC of the pipelined ADC of FIG. 1 in more detail according to yet a further example embodiment of the present disclosure.

FIG. 8A illustrates the MDAC 111 of FIG. 1 according to an alternative example embodiment to those of FIGS. 4 and 6. The circuit of FIG. 8A is similar to the circuit of FIG. 6, and like features have been labeled with like reference numerals and will not be described again in detail.

The difference between the embodiment of FIG. 8A and that of FIG. 6 is that, in the MDAC 111 of FIG. 8A, the nodes 626 and 636 are respectively coupled via the switches 628 and 638 to the output node $V_{OUT-}$ of the differential amplifier 202 rather than to the input node 210, and the nodes 666 and 676 are respectively coupled via the switches 668 and 678 to the output node $V_{OUT+}$ of the differential amplifier 202 rather than to the input node 240. The nodes 606 and 616 are also coupled to the output node $V_{OUT-}$ of the differential amplifier 202 via corresponding switches 802, 804 controlled by a phase signal φ1'. Similarly, the nodes 646 and 656 are also coupled to the output node $V_{OUT+}$ of the differential amplifier 202 via corresponding switches 806, 808 controlled by the phase signal φ1'.

Furthermore, in the circuit of FIG. 8A, the nodes 626 and 636 are for example additionally coupled to the ground voltage rail via switches 810 and 812 respectively, and the nodes 666 and 676 are for example additionally coupled to the ground voltage rail via switches 814 and 816 respectively. The switches 810 to 816 are for example controlled by the phase signal φ1, allowing the capacitors 622, 624, 662 and 664 to be reset to ground during this phase. Alternatively, however, the switches 810 to 816 could be omitted.

The switches 610, 620, 650 and 660 are for example controlled by a phase signal φ2' in the embodiment of FIG. 8A.

Operation of the MDAC of FIG. 8A will now be described with reference to FIGS. 8B, 9A and 9B.

Figure 8B:
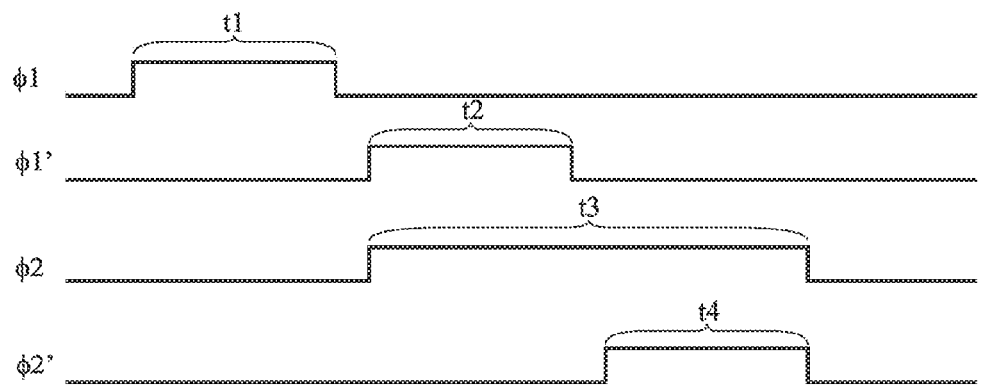
FIG. 8B is a timing diagram illustrating examples of control signals in the circuit of FIG. 8A according to an example embodiment.

FIG. 8B is a timing diagram illustrating examples of the phase signals φ1, φ1', φ2 and φ2' in the circuit of FIG. 8A according to an example embodiment.

Figure 9B:
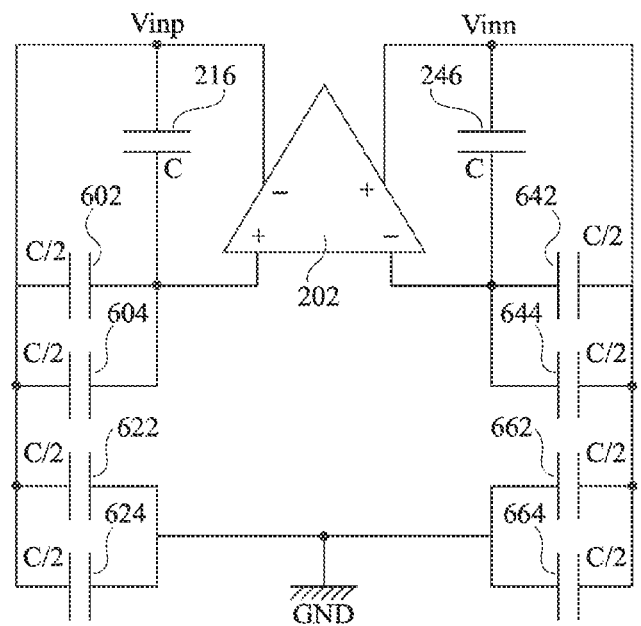
FIGS. 9A and 9B represent operating phases of the MDAC of FIG. 8A according to yet a further example embodiment of the present disclosure.
Figure 9A:
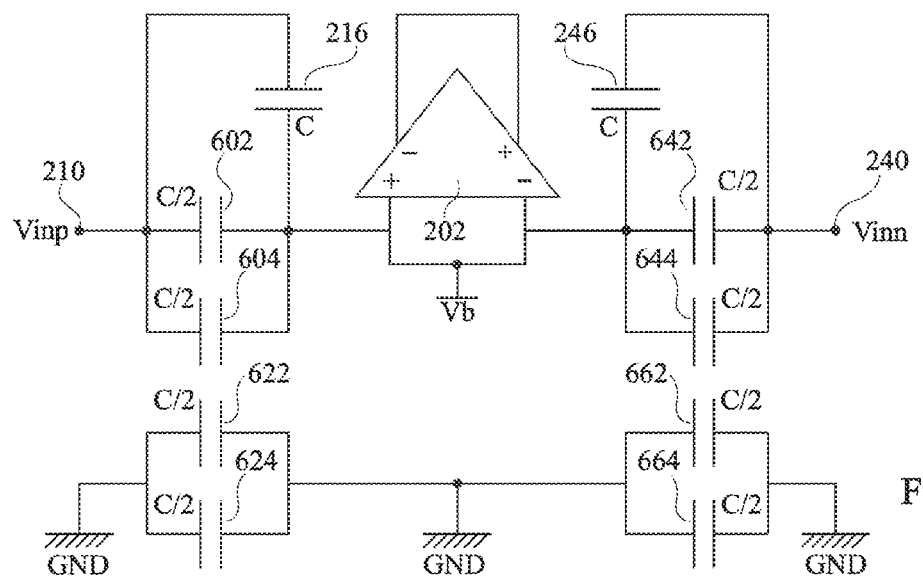

FIG. 9A illustrates a sampling phase during which the phase signal φ1 is asserted. As represented in FIG. 8B, the phase signal φ1 is for example asserted for a first period t1. Thus the nodes 606, 616 and 212 are coupled to the input node 210, and the nodes 646, 656 and 242 are coupled to the input node 240. The nodes 626, 636, 666 and 676 are for example coupled to ground. Thus only the capacitors 216, 246, 602, 604, 642 and 644 are charged based on the input signals.

FIG. 9B illustrates a second phase during which the phase signals φ' and φ2 are asserted. As represented in FIG. 8B, the signal φ1' is for example asserted for a period t2, the signal φ2 is for example asserted for a period t3 starting at the same time as the period t2. The signals φ1' and φ2 are for example asserted a short time after the signal φ1 is deactivated, such that there is no overlap between the period t1 and the periods t2, t3. Thus, whereas in the embodiment of FIG. 7A the input driver charged the dummy capacitors 622, 624, 662 and 664 in a continuous time mode, i.e. a high frequency varying signal, in the embodiment of FIG. 9B the amplifier 202 is driving the dummy capacitors in a switched capacitor mode, i.e. the signal is settling. Thus the differential amplifier 202 charges the capacitors 622, 624 and 662, 664 based on the input signals previously stored on the other capacitors, without adding additional capacitive load to the input nodes 210, 240. In a final phase, the phase signal φ1' is deactivated while the phase signal φ2 remains asserted, and the phase signal φ2' is asserted, resulting in the same configuration as illustrated in FIG. 7B described above, which will not be described again. With reference to FIG. 8B, the phase signal φ2' is for example asserted for a period t4 starting shortly after the end of the period t2, such that there is no overlap between the periods t2 and t4. The periods t3 and t4 for example end at the same time.

While the periods t1, t2 and t4 are represented as being equal in duration in FIG. 8B, in alternative embodiments they could have different durations. For example, the periods t1 and t2 could be substantially equal in duration, and the period t4 equal to substantially twice the duration of the period t1.

An advantage of the embodiment of FIG. 8A with respect to that of FIG. 6 is that the input driver is not loaded with a high frequency continuous time signal. An advantage of the embodiment of FIG. 8A with respect to that of FIG. 4 is that the feedback factor is not reduced.

An advantage of the embodiments of the MDAC described herein is that the charge demand from the reference voltage levels is no longer signal dependent. This means that it is no longer necessary to allow a generous time delay between sampling phases in order to permit the reference levels to settle. Indeed, even if the references have not fully settled from one sampling phase to the next, as the charge demand from each reference is constant, it will affect each of the references in the same way, and will thus not leave a signature of the input signal on the reference levels. For example, each MDAC is for example capable of operating at a frequency of a few hundred MHz in a 12-bit pipelined ADC and with a current consumption of just a few mA.

Having thus described at least one illustrative embodiment, various alterations, modifications and improvements will readily occur to those skilled in the art. For example, it will be apparent to those skilled in the art that while particular example embodiments have been described in which the MDAC is part of the stage of a pipelined ADC, the described circuit could have other applications.

Furthermore, it will be apparent to those skilled in the art that, in the embodiment of FIG. 2, the switches 222, 252 could be omitted if the switches 226, 228, 230, 256, 258 and 260 are controlled by the phase signal φ2. Similarly, in the embodiment of FIG. 4, the switches 410, 420, 440, 450 could be omitted if the switches 414, 416, 424, 426, 444, 446, 454 and 456 are controlled by the phase signal φ2. Similarly, in the embodiments of FIGS. 6 and 8A, the switches 610, 620, 630, 640, 650, 660, 670 and 680 could be omitted if the switches of the selection circuits 611, 621, 631, 641, 651, 661, 671 and 681 are controlled by the phase signal φ2 in FIG. 6 or by the phase signal φ2' in FIG. 8A.

The invention claimed is:

1. A multiplying digital to analog converter (MDAC), comprising:
    first and second inputs configured to receive first and second differential input signals;
    a differential amplifier having first and second differential input nodes and first and second differential output nodes;
    a first capacitor having one node coupled to the first differential input node and another node coupled to the first input via a first switch and further coupled to at least one reference voltage supply node via at least one further switch; and
    a second capacitor having a node coupled to the first differential input node;
    a third capacitor having a node coupled to the first differential input node; and
    a fourth capacitor having one node coupled to the first differential input node and another node coupled to the first differential output node;
    wherein a capacitance of each of the second and third capacitors is equal to one half of a capacitance of each of the first and fourth capacitors.

2. A multiplying digital to analog converter (MDAC), comprising:
    first and second inputs configured to receive first and second differential input signals;
    a differential amplifier having first and second differential input nodes and first and second differential output nodes;
    a first capacitor having one node coupled to the first differential input node and another node coupled to the first input via a first switch and further coupled to at least one reference voltage supply node via at least one further switch; and
    second and third capacitors each having a node coupled to one of:
        the first differential input node;
        the first differential output node; and
        the first input;
    wherein:
        the another node of the first capacitor is further coupled to a first reference voltage supply node via a first further switch;
        the second capacitor has one node coupled to the first differential input node and another node coupled to second and third reference voltage supply nodes via a first selection circuit; and
        the third capacitor has one node coupled to the first differential input node and another node coupled to the second and third reference voltage supply nodes via a second selection circuit.

3. The MDAC of claim 2, further comprising a control circuit configured to control, during a second phase:
    the first further switch to couple the first capacitor to the first reference voltage;
    the first selection circuit to couple the second capacitor to one of the second and third reference voltage supply nodes selected based on a digital conversion of the first and second differential input signals; and
    the second selection circuit to couple the second capacitor to one of the second and third reference voltage supply nodes selected based on said digital conversion.

4. The MDAC of claim 2, further comprising:
    a fourth capacitor having one node coupled to the second differential input node and another node coupled to the second input via a first switch and to the first reference voltage via a second further switch; and
    fifth and sixth capacitors, wherein:
        the fifth capacitor has one node coupled to the second differential input node and another node coupled to the second and third reference voltages via a third selection circuit; and
        the sixth capacitor has one node coupled to the second differential input node and another node coupled to the second and third reference voltages via a fourth selection circuit.

5. The MDAC of claim 4, wherein the first capacitor has the another node coupled to at least one reference voltage supply rail via a fifth selection circuit, the MDAC further comprising:
- a seventh capacitor having one node coupled to the first differential input node and another node coupled to the first input via a second switch and coupled to at least one reference voltage supply node via a sixth selection circuit.

6. The MDAC of claim 5, wherein:
- the second capacitor has one node coupled to the first reference voltage rail and another node coupled to the first input via a third switch and coupled to second and third reference voltage supply nodes via a seventh selection circuit; and
- the third capacitor has one node coupled to the first reference voltage supply node and another node coupled to the first input via a fourth switch and coupled to the second and third reference voltage supply nodes via an eighth selection circuit.

7. The MDAC of claim 6, further comprising a control circuit configured to:
- control, during a first phase, the first, second, third and fourth switches to couple the first, second, third and seventh capacitors to the first input; and
- control, during a second phase, the fifth, sixth, seventh and eighth selection circuits to couple each of the first, second, third and seventh capacitors to one of the first, second and third reference voltage supply nodes based on a digital conversion of the first and second differential input signals.

8. The MDAC of claim 5, further comprising:
- an eighth capacitor having one node coupled to the second differential input node and another node coupled to the second input via a fifth switch and coupled to at least one reference voltage supply node via one or more further switches;
- a ninth capacitor having one node coupled to the second differential input node and another node coupled to the second input via a sixth switch and coupled to at least one reference voltage supply node via one or more further switches;
- a tenth capacitor having one node coupled to the first reference voltage supply node and another node coupled to the second input via a seventh switch and coupled to the second and third reference voltage supply nodes via a ninth selection circuit; and
- an eleventh capacitor having one node coupled to the first reference voltage supply node and another node coupled to the second input via an eighth switch and coupled to the second and third reference voltage supply nodes via a tenth selection circuit.

9. The MDAC of claim 5, wherein the second capacitor has one node coupled to a first reference voltage supply node and another node coupled to the first differential output node and coupled to second and third reference voltage supply nodes via a seventh selection circuit; and
- the third capacitor has one node coupled to the first reference voltage supply node and another node coupled to the first differential output node and coupled to the second and third reference voltage supply nodes via an eighth selection circuit.

10. The MDAC of claim 9, further comprising a control circuit configured to:
- control, during an initial phase, the one or more further switches to couple the first and seventh capacitors to the first input and the sixth and seventh selection circuits to couple the second and third capacitors to the first reference voltage.

11. The MDAC of claim 9, further comprising
- an eighth capacitor having one node coupled to the second differential input node and another node coupled to the second input via a fifth switch and coupled to at least one reference voltage supply node via one or more further switches;
- a ninth capacitor having one node coupled to the second differential input node and another node coupled to the second input via a sixth switch and coupled to at least one reference voltage supply node via one or more further switches;
- a tenth capacitor having one node coupled to the first reference voltage supply node and another node coupled to the second differential output node via a seventh switch and coupled to the second and third reference voltage supply nodes via a ninth selection circuit; and
- an eleventh capacitor having one node coupled to the first reference voltage supply node and another node coupled to the second differential output node via an eighth switch and coupled to the second and third reference voltage supply nodes via a tenth selection circuit.

12. The MDAC of claim 5, wherein the first, second, third and seventh capacitors each have a capacitance that is one-half a capacitance of a twelfth capacitor coupled between the differential input and output nodes of the differential amplifier.

13. A multiplying digital to analog converter (MDAC), comprising:
- first and second inputs configured to receive first and second differential input signals;
- a differential amplifier having first and second differential input nodes and first and second differential output nodes;
- a first capacitor having one node coupled to the first differential input node and another node coupled to the first input via a first switch and further coupled to at least one reference voltage supply node via at least one further switch; and
- second and third capacitors each having a node coupled to one of:
  - the first differential input node;
  - the first differential output node; and
  - the first input;
- wherein:
  - the second capacitor has one node coupled to the first reference voltage supply node and another node coupled to either the first input or the first differential output node; and
  - the third capacitor has one node coupled to the first reference voltage supply node and another node coupled to one of the first input and the first differential output node.

14. A multiplying digital to analog converter (MDAC), comprising:
- first and second inputs configured to receive first and second differential input signals;
- a differential amplifier having first and second differential input nodes and first and second differential output nodes;
- a first capacitor coupled between the first differential input node and a first intermediate node;

a first switch coupled between the first intermediate node and the first input, said first switch actuated by a first phase signal;
a second capacitor coupled between the first differential input node and a second intermediate node;
a second switch coupled between the first input and the second intermediate node, said second switch actuated by the first phase signal;
a third switch coupled between the second intermediate node and the first differential output node, said third switch actuated by a second phase signal; and
a fourth switch coupled between the first intermediate node and a fourth intermediate node, said fourth switch actuated by the second phase signal;
wherein said fourth intermediate node is configured to selectively receive one of a negative reference voltage, a ground voltage and a positive reference voltage.

15. The MDAC of claim 14, further comprising a selection circuit having inputs configured to receive the negative reference voltage, the ground voltage and the positive reference voltage and having an output coupled to the fourth intermediate node.

16. The MDAC of claim 15, wherein said selection circuit further includes a control input configured to receive a control signal for controlling selection of said one of the negative reference voltage, the ground voltage and the positive reference voltage, said control signal having a control value based on a digital conversion of the first and second differential input signals.

17. The MDAC of claim 15, wherein said circuit comprises:
a fifth switch coupled between the fourth intermediate node and a ground reference node, said fifth switch actuated by the first phase signal; and
a sixth switch coupled between the fourth intermediate node and a fifth intermediate node configured to selectively receive the negative reference voltage and the positive reference voltage, said sixth switch actuated by the second phase signal.

18. The MDAC of claim 17, further comprising a selection circuit having inputs configured to receive the negative reference voltage and the positive reference voltage and having an output coupled to the fifth intermediate node.

19. The MDAC of claim 18, wherein the selection circuit further includes a control input configured to receive a control signal for controlling selection of said one of the negative reference voltage and the positive reference voltage, said control signal having a control value based on a digital conversion of the first and second differential input signals.

20. The MDAC of claim 14, further comprising:
a fifth switch coupled between the first and second differential input nodes, said fifth switch actuated by the first phase signal; and
a sixth switch coupled between the first and second differential output nodes, said sixth switch actuated by the first phase signal.

21. The MDAC of claim 20, further comprising:
a seventh switch coupled between the first differential input node and a bias voltage node, said seventh switch actuated by the first phase signal; and
an eighth switch coupled between the second differential input node and the bias voltage node, said eighth switch actuated by the first phase signal.

22. A multiplying digital to analog converter (MDAC), comprising:
first and second inputs configured to receive first and second differential input signals;
a differential amplifier having first and second differential input nodes and first and second differential output nodes;
a first capacitor coupled between the first differential input node and a first intermediate node;
a first switch coupled between the first intermediate node and the first input, said first switch actuated by a first phase signal;
a second capacitor coupled between the first differential input node and a second intermediate node;
a second switch coupled between the first input and the second intermediate node, said second switch actuated by the first phase signal;
a third switch coupled between the second intermediate node and the first differential output node, said third switch actuated by a second phase signal; and
a fourth switch coupled between the first intermediate node and a ground reference node, said fourth switch actuated by the second phase signal.

23. The MDAC of claim 22, further comprising:
a third capacitor coupled between the first differential input node and a third intermediate node;
wherein said third intermediate node is configured to selectively receive one of a negative reference voltage, a ground voltage and a positive reference voltage.

24. The MDAC of claim 23, wherein a capacitance of the third capacitor is one-half a capacitance of each of the first and second capacitors.

25. The MDAC of claim 23, further comprising a circuit having inputs configured to receive the negative reference voltage, the ground voltage and the positive reference voltage and having an output coupled to the fourth intermediate node.

26. The MDAC of claim 22, further comprising:
a seventh switch coupled between the first and second differential input nodes, said seventh switch actuated by the first phase signal; and
an eighth sixth switch coupled between the first and second differential output nodes, said eighth switch actuated by the first phase signal.

27. The MDAC of claim 26, further comprising:
a ninth switch coupled between the first differential input node and a bias voltage node, said ninth switch actuated by the first phase signal; and
a tenth switch coupled between the second differential input node and the bias voltage node, said tenth switch actuated by the first phase signal.

28. A multiplying digital to analog converter (MDAC), comprising:
first and second inputs configured to receive first and second differential input signals;
a differential amplifier having first and second differential input nodes and first and second differential output nodes;
a first capacitor coupled between the first differential input node and a first intermediate node;
a first switch coupled between the first intermediate node and the first input, said first switch actuated by a first phase signal;
a second capacitor coupled between the first differential input node and a second intermediate node;

a second switch coupled between the first input and the second intermediate node, said second switch actuated by the first phase signal;
a third switch coupled between the second intermediate node and the first differential output node, said third switch actuated by a second phase signal;
a fourth switch coupled between the first intermediate node and a third intermediate node, said fourth switch actuated by the second phase signal; and
a selection circuit having inputs configured to receive a negative reference voltage and a positive reference voltage and having an output coupled to the third intermediate node, said selection circuit further including a control input configured to receive a control signal for controlling selection of one of the negative reference voltage and the positive reference voltage, said control signal having a control value based on a digital conversion of the first and second differential input signals.

29. The MDAC of claim 28, wherein a capacitance of the first capacitor is one-half a capacitance of the second capacitor.

30. The MDAC of claim 28, further comprising:
a third capacitor coupled between a ground reference node and a fourth intermediate node;
a fifth switch coupled between the fourth intermediate node and the first input, said fifth switch actuated by the first phase signal;
a sixth switch coupled between a fifth intermediate node and the fourth intermediate node, said sixth switch actuated by the second phase signal; and
a further selection circuit having inputs configured to receive the negative reference voltage and the positive reference voltage and having an output coupled to the fifth intermediate node, said further selection circuit further including a control input configured to receive a further control signal for controlling selection of one of the negative reference voltage and the positive reference voltage, said further control signal having a control value based on a digital conversion of the first and second differential input signals.

31. The MDAC of claim 30, wherein a capacitance of the third capacitor is one-half a capacitance of the second capacitor.

32. The MDAC of claim 28, further comprising:
a seventh switch coupled between the first and second differential input nodes, said seventh switch actuated by the first phase signal; and
an eighth sixth switch coupled between the first and second differential output nodes, said eighth switch actuated by the first phase signal.

33. The MDAC of claim 32, further comprising:
a ninth switch coupled between the first differential input node and a bias voltage node, said ninth switch actuated by the first phase signal; and
a tenth switch coupled between the second differential input node and the bias voltage node, said tenth switch actuated by the first phase signal.

34. A multiplying digital to analog converter (MDAC), comprising:
first and second inputs configured to receive first and second differential input signals;
a differential amplifier having first and second differential input nodes and first and second differential output nodes;
a first capacitor coupled between the first differential input node and a first intermediate node;
a first switch coupled between the first intermediate node and the first input, said first switch actuated by a first phase signal;
a second capacitor coupled between the first differential input node and a second intermediate node;
a second switch coupled between the first input and the second intermediate node, said second switch actuated by the first phase signal;
a third switch coupled between the second intermediate node and the first differential output node, said third switch actuated by a second phase signal;
a fourth switch coupled between the first intermediate node and a third intermediate node, said fourth switch actuated by a third phase signal;
a fifth switch coupled between the first intermediate node and the first differential output node, said fifth switch actuated by a fourth phase signal; and
a selection circuit having inputs configured to receive a negative reference voltage and a positive reference voltage and having an output coupled to the third intermediate node, said selection circuit further including a control input configured to receive a control signal for controlling selection of one of the negative reference voltage and the positive reference voltage, said control signal having a control value based on a digital conversion of the first and second differential input signals.

35. The MDAC of claim 34, wherein fourth phase signal is asserted after said first phase signal, wherein said fourth phase signal is asserted during a first part of assertion of the second phase signal, and wherein said third phase signal is asserted during a second part of assertion of the second phase signal.

* * * * *

UNITED STATES PATENT AND TRADEMARK OFFICE
CERTIFICATE OF CORRECTION

PATENT NO. : 9,698,815 B1  
APPLICATION NO. : 15/237767  
DATED : July 4, 2017  
INVENTOR(S) : Mounir Boulemnakher et al.

Page 1 of 1

It is certified that error appears in the above-identified patent and that said Letters Patent is hereby corrected as shown below:

In the Specification

At Column 5, Line number 10, please replace the term [[-$V_F/4$]] with the term -- -$V_{REF}/4$ --.

At Column 7, Line number 43, please replace the term [[-$V_F/4$]] with the term -- -$V_{REF}/4$ --.

At Column 9, Line number 49, please replace the term [[+$V_F/4$]] with the term -- +$V_{REF}/4$ --.

At Column 11, Line number 38, please replace the term [[+$V_F/4$]] with the term -- +$V_{REF}/4$ --.

Signed and Sealed this  
Twenty-second Day of August, 2017

Joseph Matal  
*Performing the Functions and Duties of the*  
*Under Secretary of Commerce for Intellectual Property and*  
*Director of the United States Patent and Trademark Office*